United States Patent [19]

Murakami et al.

[11] Patent Number: 4,673,832
[45] Date of Patent: Jun. 16, 1987

[54] SAFETY DEVICE FOR ELECTRONIC EQUIPMENTS

[75] Inventors: Yuichi Murakami; Tomohiro Yamamoto, both of Tokyo, Japan

[73] Assignee: Aisin Seiki Kabushiki Kaisha, Kariya, Japan

[21] Appl. No.: 839,242

[22] Filed: Mar. 13, 1986

[30] Foreign Application Priority Data

Mar. 13, 1985 [JP] Japan .................................. 60-49863

[51] Int. Cl.⁴ .............................................. H01Q 1/38
[52] U.S. Cl. ................................. 307/326; 307/10 R; 455/297; 455/222; 455/223; 343/795
[58] Field of Search ............... 307/326, 10 R; 361/88, 361/110, 111; 340/292; 455/213, 308, 296, 297, 130, 135, 136, 137, 138, 139, 140, 285, 297, 222, 223, 211, 217; 328/165; 343/859, 700 MS, 860, 795, 797, 711, 712, 713, 756

[56] References Cited

U.S. PATENT DOCUMENTS

| | | | |
|---|---|---|---|
| 2,859,338 | 11/1958 | Paluka | 455/211 |
| 3,509,468 | 4/1970 | Overlie | 455/222 X |
| 3,603,884 | 9/1971 | Zaura | 455/222 |
| 3,654,488 | 4/1972 | Traub et al. | 455/308 X |
| 3,761,823 | 9/1973 | Harris | 455/297 |
| 3,921,074 | 11/1975 | Baird | 455/308 X |
| 3,925,774 | 12/1975 | Amlung | 343/795 X |
| 4,042,883 | 8/1977 | Rae | 455/308 X |
| 4,063,175 | 12/1977 | Friedman | 4355/297 X |
| 4,063,246 | 12/1977 | Greiser | 343/700 MS |
| 4,079,268 | 3/1978 | Fletcher et al. | 343/700 MS X |
| 4,083,046 | 4/1978 | Kaloi | 343/700 MS |
| 4,097,868 | 6/1978 | Borowick | 343/795 X |
| 4,117,489 | 9/1978 | Kaloi | 343/700 MS |
| 4,198,633 | 4/1980 | Krajewski | 328/165 X |
| 4,241,453 | 12/1980 | Drake | 455/217 X |
| 4,293,736 | 10/1981 | Ogita | 455/223 X |
| 4,370,522 | 1/1983 | Takeda et al. | 343/711 X |
| 4,525,870 | 6/1985 | Fukuhara et al. | 455/297 |
| 4,584,714 | 4/1986 | Fukuhara | 455/298 X |

Primary Examiner—William M. Shoop, Jr.
Assistant Examiner—Shik Luen Paul Ip
Attorney, Agent, or Firm—Sughrue, Mion, Zinn Macpeak & Seas

[57] ABSTRACT

A safety device to prevent a vehicle-loaded electronic equipment from malfunctioning due to an influence of the high-level electric field. An antenna pattern for detecting the electric field is formed on the same printed board as the electronic equipment, and an electric signal level of the output from the antenna pattern is determined. When the determined level reaches a level at which the electronic equipment may malfunction, the equipment is forcibly controlled toward a safety range of operation.

6 Claims, 9 Drawing Figures

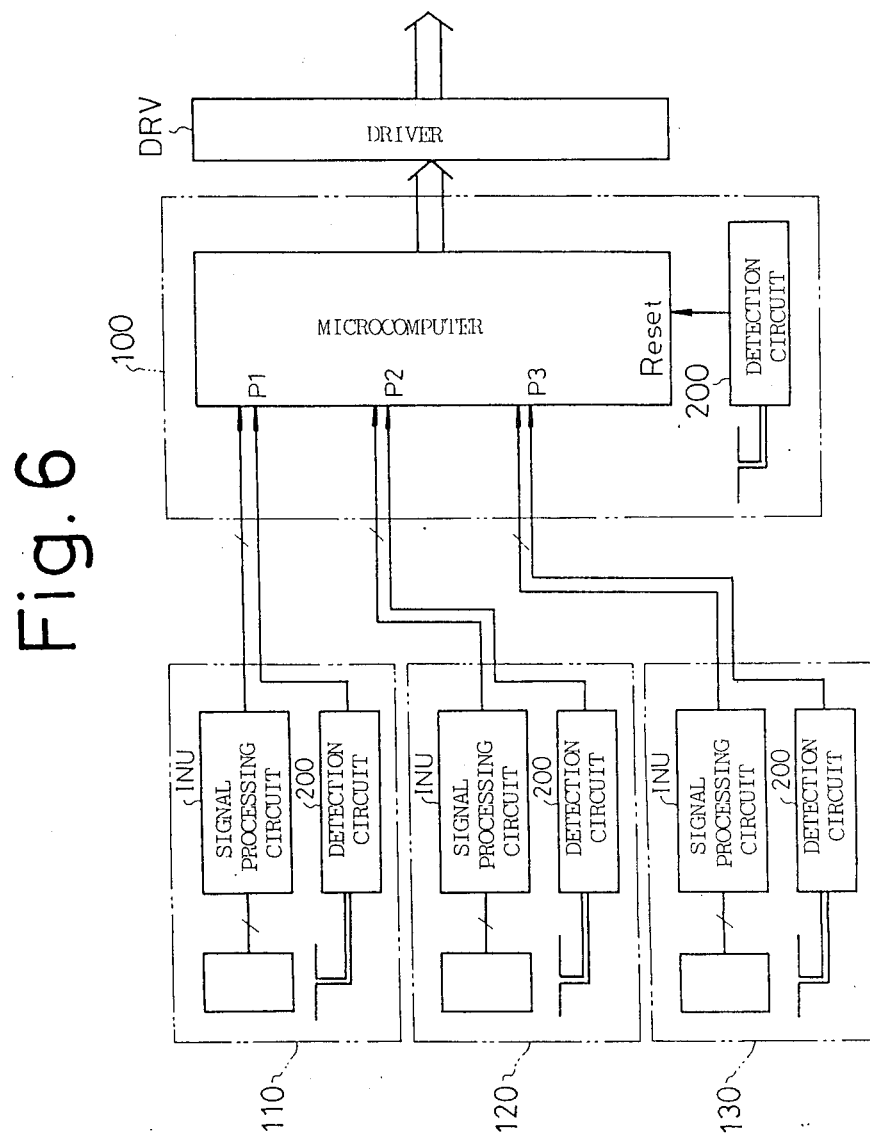

SAFETY DEVICE FOR ELECTRONIC EQUIPMENTS

BACKGROUND OF THE INVENTION

The invention relates to a safety device which can prevent electronic equipments loaded on vehicles, for example, from malfunctioning in electrostatic environment of high level.

With development of the electronics industry, a quite large number of electronic devices are put into use everywhere in recent years. Such electronic devices include numbers of units for delivering large electric energy into an atmosphere in the form of signals to be transmitted, such as communication equipments, and units releasing relatively large noises into an atmosphere in the form of electric energy due to switching of large electric power. In an atmosphere, therefore, electric energy of relatively large level is present in the form of electromagnetic waves.

In these days, there are also employed numerous electronic devices handling a minute signal, which are susceptible to electric energy or noises in an atmosphere. Stated otherwise, electric energy in an atmosphere induces an electric signal (noise) on conductors, particularly electric wiring patterns, contained in such electronic device, as a result of which the device will malfunction when the noise level becomes equal to or higher than a level of the signal handled by the device.

In case of household equipments which may malfunction due to an influence of electromagnetic waves, for example, the above problem can be overcome for each equipment by arranging such as a wireless transmitter radiating electromagnetic waves in a position far away from the concerned equipment, because it is placed to be stationary. However, in case of electronic equipments which are loaded on mobile vehicles such as automobiles, the equipment may be subjected to the electric field of extremely high level dependent on a location of the automobile along its cruising route. Also, when a wireless apparatus is loaded on the automobile, it is practically impossible for the wireless apparatus to be placed far away from the concerned equipment which may suffer from disturbances. Japanese Automobile Electronics Research Committee has confirmed that an electronic equipment on automobiles is subjected to an environment possibly undergoing the electric field in order of 60 (V/m). It is very important for safety that such an electronic equipment on automobile is designed so as not to malfunction, particularly when it has a control function in relation to movement of the automobile. From this reason, an electronic equipment loaded on automobiles requires to be tested under an environment in which the electric field in order of the above-mentioned level is applied.

In the past, malfunctioning of electronic equipments in electrostatic environment of high level has been coped with as follows:

(a) To avoid electromagnetic waves from entering the equipment, an electronic circuit section in the equipment is entirely covered with a metal for electrostatic shielding; and (b) A capacitor allowing needless components of high-frequency signal to pass therethrough is attached to each of all those parts in an electronic circuit which are especially susceptible to the electric field.

However, the method (a) cannot completely shield the connecting section of input and output lines used for connecting the concerned electronic circuit to another unit. For the method (b), such a capacitor cannot be attached to the parts handling a high-frequency signal. Moreover, the methods (a) and (b) are both disadvantageous in that the number of components is increased, design and manufacture of the equipment are complicated, and the cost is raised up correspondingly.

SUMMARY OF THE INVENTION

It is an object of the invention to provide a safety device at the reduced cost, which can prevent electronic equipments from malfunctioning in electrostatic environment of high level.

To achieve the above object, in accordance with the invention, the safety device comprises; electric field detecting means arranged on the same printed board as an electronic equipment which is susceptible to the electric field; signal level decision means for comparing a level of the signal output from the electric field detecting means with a predetermined reference level and for delivering the compared result; and abnormality processing setting means for setting the electronic equipment into an abnormality processing state, when an output of the signal level decision means is found to be abnormal.

It occurs only temporarily that an electronic equipment on automobiles is brought into electrostatic environment of high level in which it may malfunction. In such abnormal condition, therefore, the electronic equipment can be fixed or stopped in operation without problems. Stated otherwise, accidents or danger due to temporary malfunctioning can be prevented by forcibly setting operation of the electronic equipment toward a safety range.

The electric field detecting means, i.e., antenna, which is provided on the same printed board as the electronic equipment to be rid of malfunction, makes it possible to detect the electric field prevailing the electrostatic environment to which the electronic equipment is subjected in practice. Accordingly, malfunctioning of the electronic equipment is surely prevented by comparing a level of the signal output from the electric field detecting means with a predetermined reference level and setting the electronic equipment into an abnormality processing state, for example, a reset state, when the compared result indicates the electric field of abnormally high level.

In this connection, the electric field affecting electronic equipments is not limited to particular frequencies. Therefore, the means for detecting the electric field is desirously capable of detecting any frequencies with the same sensitivity. If the sensitivity of the electronic field detecting means is largely different dependent on frequencies, there occurs a difference in levels of the electric field to be detected for decision of abnormality, thus resulting in a fear that the safety device will not be operated under the electric field other than particular frequencies, or it will operate in response to the electric field of low level in which electronic equipments may not come into trouble.

Meanwhile, usual antennas are able to detect a signal in a particular narrow frequency band only, because they operate in a resonated state. In a preferred embodiment of the invention, therefore, an antenna is employed which is sufficiently short with respect to a wavelength at the maximum frequency in a band of frequencies to be detected (in practice, each conductor has a length less than λ/8: λ is a wavelength). As described later, such an antenna exhibits a uniform characteristic of sensitivity over a wide band of frequencies. Although the sensitivity of this type antenna is very low, there will cause no problem because the antenna is only required to detect the electric field of high level in use of the invention.

BRIEF DESCRIPTION OF THE DRAWINGS

FIG. 5b is a block diagram showing the circuit constitution of the embodiment of FIG. 5a; and FIG. 6 is a block diagram showing still another embodiment.

DESCRIPTION OF THE PREFERRED EMBODIMENTS

Figure 1:
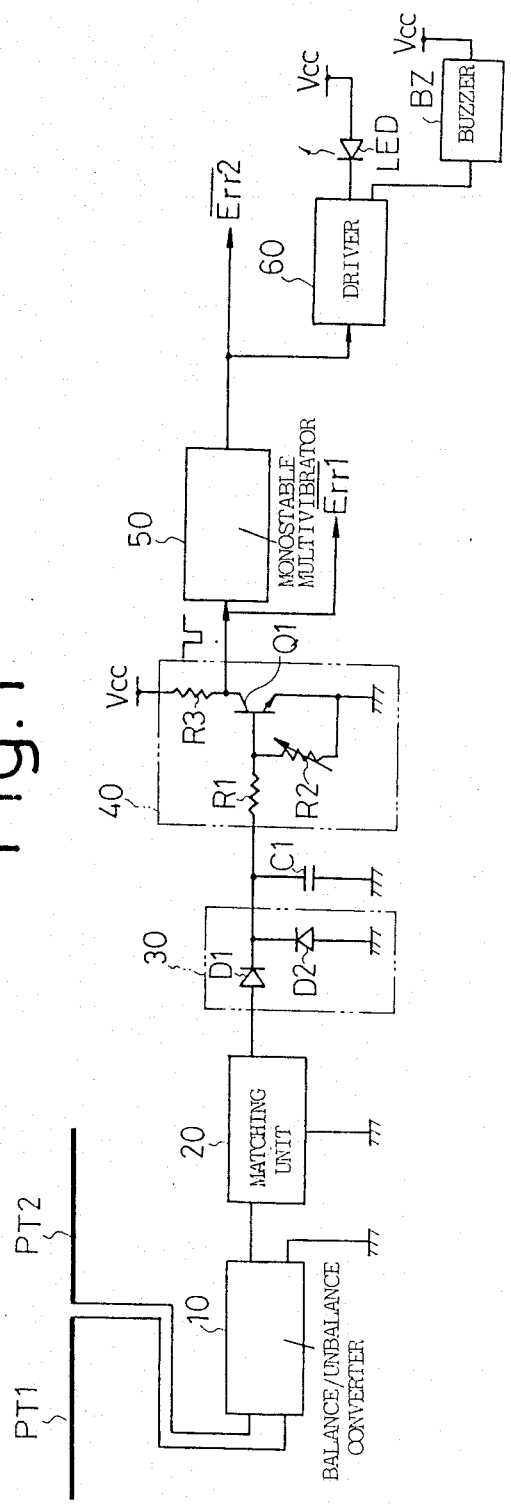
FIG. 1 is a block diagram showing the constitution of a detection circuit according to one embodiment of the invention.

Hereinafter, several preferred embodiments of the invention will be described by referring to the drawings.

FIG. 1 shows an electric circuit diagram of a detection circuit 200. Referring to FIG. 1, the detection circuit 200 includes a balance/unbalance converter 10, a matching unit 20, a detector circuit 30, a smoothing circuit (capacitor C1), a decision circuit 40, a monostable multivibrator (circuit) 50, a driver 60, a buzzer BZ, and a light emitting diode LED. A pair of conductors PT1 and PT2 as an antenna are connected to input terminals of the balance/unbalance converter 10.

Figure 2:
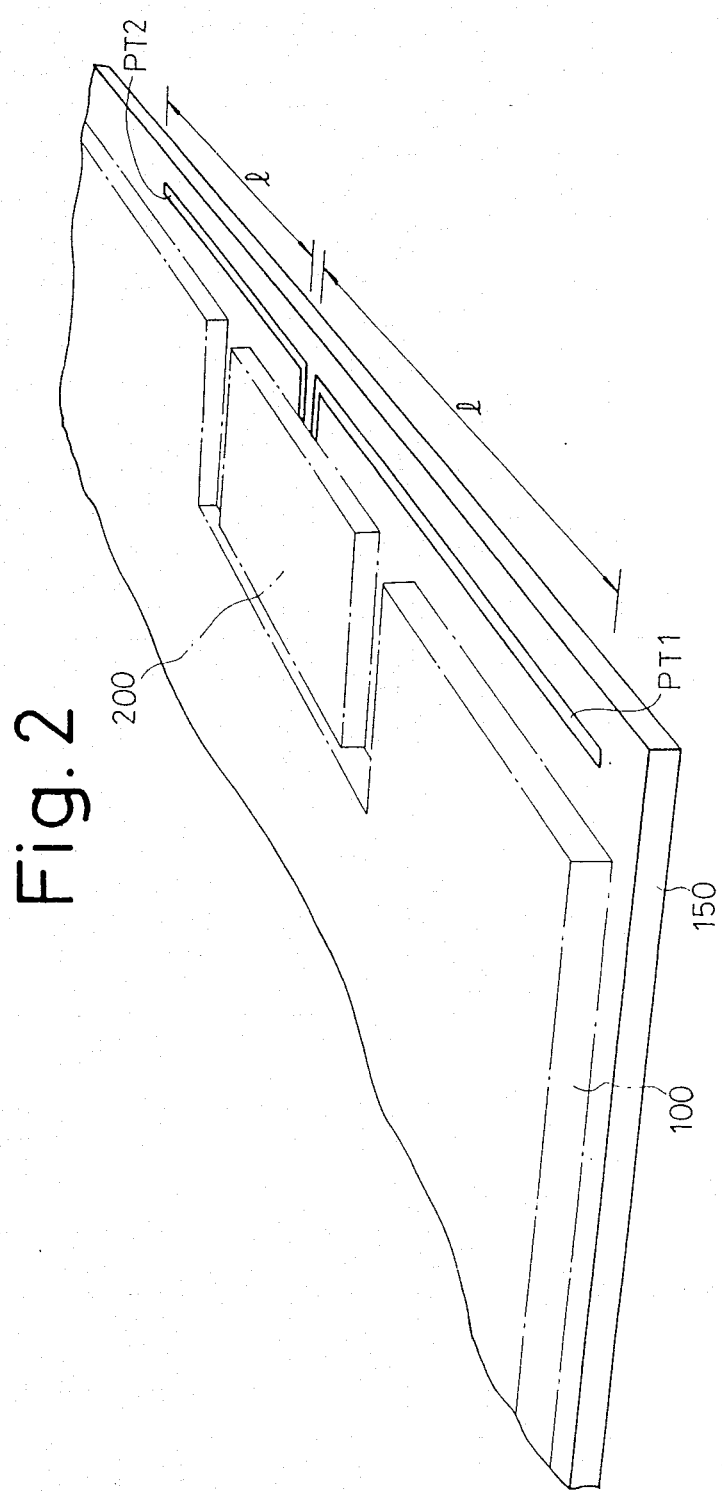
FIG. 2 is a perspective view schematically showing an external appearance of an electronic control circuit of the vehicle-loaded device.

FIG. 2 schematically shows an external appearance of the electronic control circuit of a vehicle-loaded device 100. Referring to FIG. 2, the detection circuit 200 and the antenna in FIG. 1 are both arranged on the same printed board 150 as the vehicle-loaded device 100. Specifically, the pair of conductors PT1 and PT2 constituting the antenna are formed on the printed board 150 as a part of its printed pattern. The conductors PT1 and PT2 have each a length l (5 cm in this embodiment), and are arranged such that their one ends are close to each other and the other ends are extended in opposite directions. Those one ends of the conductors close to each other are electrically connected to the detection circuit 200 through pieces of conductor patterns for feeding. In other words, the two conductors PT1 and PT2 constitute a dipole antenna of central feeding type.

Referring back to FIG. 1, because of the balanced type antenna (PT1, PT2), the converter 10 is employed to obtain an unbalanced output. The matching unit 20 has a function of impedance matching between the antenna and the detector circuit 30. The detection circuit 30 comprises a pair of diodes D1, D2 and converts a high-frequency signal collected by the antenna to the full-wave rectified waveform. This full-wave rectified waveform is smoothed through a capacitor C1 connected to an output of the detector circuit 30, so that a signal of direct-current level corresponding to a magnitude of the detected electric field is applied to an input terminal of the decision circuit 40.

The decision circuit 40 comprises a transistor Q1 and three resistors R1, R2 and R3. The resistor R2 is a semi-fixed resistor adjustable in its resistance value. The transistor Q1 is normally turned off so that a high level H appears at an output, i.e., collector terminal, thereof. But when a direct-current level higher than a predetermined one is applied to the input terminal of the decision circuit 40, i.e., one end of the resistor R1, the transistor Q1 is turned on so that a low level L appears at an output terminal of the decision circuit. The output terminal of the decision circuit 40 is connected to both an error signal line Err1 and an input terminal of the monostable multivibrator 50.

At an output terminal of the monostable multivibrator 50, there outputs a low level L continuously for a predetermined time T, even if the electric field of high level be detected for a very short period of time. The output terminal of the monostable multivibrator 50 is connected to both an error signal line Err2 and the driver 60. When the input terminal receives a low level L, the driver 60 illuminates the light emitting diode LED and turns on the buzzer BZ.

Figure 3:
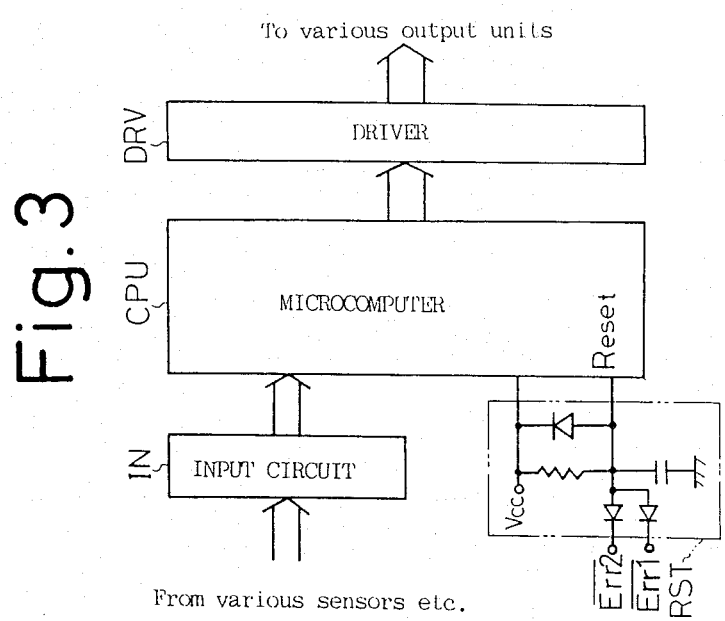
FIG. 3 is a block diagram showing the constitution of the electronic control circuit of the vehicle-loaded device.

The constitution of electronic control circuit of the vehicle-loaded device 100 is shown in FIG. 3. Referring now to FIG. 3, the electronic control circuit includes a microcomputer CPU having a reset terminal Reset to which a reset circuit RST is connected. To this reset circuit RST are connected the error signal lines Err1 and Err2 through connections in the form of logical sum. Thus, when a low level L appears on either one of the error signal lines, a reset signal is applied to the microcomputer CPU. With the reset signal applied, the microcomputer CPU returns its operation to an initial state, thereby setting output ports to initial levels. This embodiment is so designed that, while the output ports of the microcomputer CPU is set at initial levels, various output units connected to the outputs of the driver DRV are set in their status toward a safety range of operation (e.g., a vehicle speed controller is set to gradually reduce the vehicle speed).

The principles of detecting the electric field by the antenna (PT1, PT2) will be described below.

Generally, let the current flowing through a linear antenna at an arbitrary position Z be I(z) and the feeding current be I(O), an effective length Le of the antenna is given by as follows:

$$Le = (1/I(0)) \cdot \int_{Z1}^{Z2} I(z) \cdot dz (m) \tag{1}$$

In accordance with the Hallén method, assuming that a parameter Ω of the antenna be sufficiently large (Ω=2·ln2l/a: where "2l" and "a" are an overall length and radius of the antenna wire, respectively), current distribution on a linear antenna can be considered to be sine wave distribution as the first approximation due to a solution of the Hallén integration equation. Thus, the following equation is obtained on assumptions that the current be supplied to the center of the antenna and the coordinate value Z of center of the antenna be 0:

$$I(z) = Im \cdot \sin \beta(l - |z|) \tag{2}$$

where $\beta = 2\pi/\lambda$, $\lambda$: wavelength, and Im: current value at the wave side Substituting the equation (2) into the equation (1):

$$Le = (2/(Im \cdot \sin\beta l)) \cdot \int_0^l Im \cdot \sin\beta(l - z)dz \qquad (3)$$

$$= (2/\sin\beta l) \cdot [(1/\beta) \cdot \cos\beta(l - z)]_0^l$$
$$= (2/\beta) \cdot ((1 - \cos\beta l)/(\sin\beta l))$$
$$= (\lambda/\pi) \cdot \tan(l \cdot \pi/\lambda)$$

In case of $l < \lambda/8$, the equation (3) becomes as follows:

$$Le \approx (\lambda/\pi) \cdot (l \cdot \pi/\lambda)/(1 - l \cdot \pi/2\lambda) \approx l \qquad (4)$$

Namely, under the condition of $l < \lambda/8$, it will be found that an effective length of this type antenna is equal to a half length l of the antenna.

Accordingly, when the antenna is composed of two conductors each having a length of 5 cm, it can be regarded as an antenna with an effective length of 5 cm for electric waves meeting the relation of $\lambda > 40$ cm, i.e., having frequencies less than 750 MHz. In such a case, let the strength of the electric field be E(V/m), the voltage V induced on that antenna is given by the following equation:

$$V = E \cdot l \quad (V) \qquad (5)$$

If the electric field strength E is equal to 50 V/m, the voltage V become 2.5 V. In this embodiment, a resistance value of the resistor R2 is adjusted such that when the voltage of 2.5 V is produced on the antenna, the on-/off-status of the transistor Q1 is changed. Stated otherwise, in this embodiment, when the electric field strength is increased exceeding 50 V/m, the error signals (Err1, Err2) are generated and a reset signal is delivered to the vehicle-loaded device 100, to thereby prevent malfunctioning.

It should be noted that while the balance/unbalance converter 10 and the matching unit 20 are employed in the above embodiment, these components may be omitted because the invention requires to detect only the strong electric field.

Figure 4A:
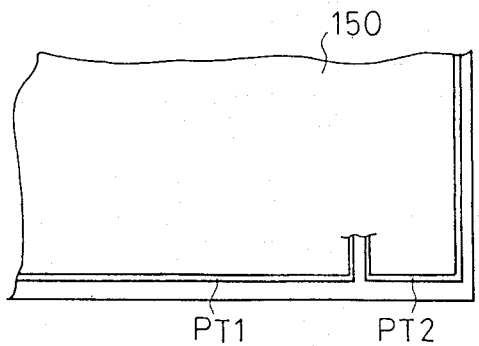
FIGS. 4a, 4b and 4c are plan views showing modified examples of an antenna.
Figure 4B:
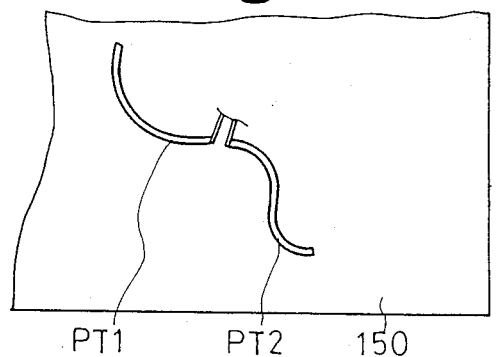
Figure 4C:
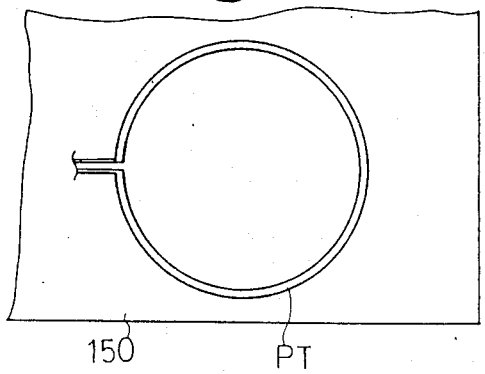

FIGS. 4a, 4b and 4c show modified examples of the antenna. Referring first to FIG. 4a, one conductor pattern PT2 in this example is bent at a right angle and extended along the periphery of the printed board 150. The example of FIG. 4a permits the antenna to be arranged at the corner of the printed board. Referring to FIG. 4b, two conductor patterns PT1, PT2 are formed into a curved shape in this example. The example of FIG. 4b permits the antenna to be arranged in an open space between the parts of the electronic controller. Referring now to FIG. 4c, a loop antenna is constituted by one conductor pattern PT1 in this example.

Figure 5A:
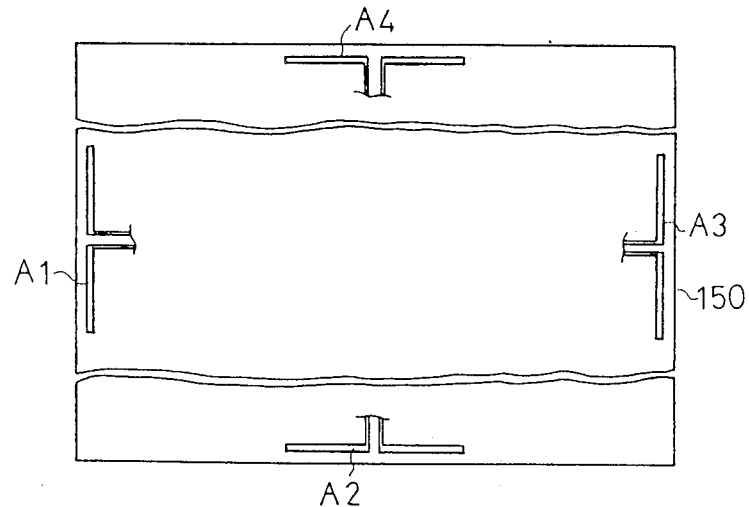
FIG. 5a is a plan view showing arrangement of an antenna according to another embodiment.
Figure 5B:
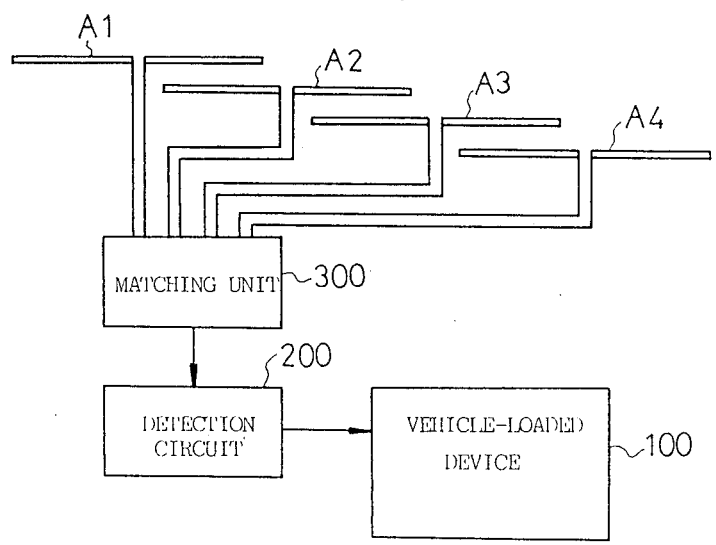

FIGS. 5a and 5b show another embodiment of the invention. In this embodiment, as seen from these figures, four dipole antennas A1, A2, A3 and A4 are arranged in peripheral portions of the printed board 150 at respective sides and connected in parallel to the detection circuit 200 via the matching unit 300.

FIG. 6 shows still another embodiment of the invention. In this embodiment, a body of the vehicle-loaded device 100 and individual signal processing units 110, 120 and 130 are arranged on separate printed boards in positions apart away from each other. Then, the individual signal processing units 110, 120 and 130 and the device body 100 include each a detection circuit 200. Output terminals or the detection circuits 200 of the individual signal processing units 110, 120 and 130 are connected to input ports P1, P2 and P3 of a microcomputer CPU, respectively. In this embodiment, when the microcomputer CPU makes reference to signals from the signal processing units, it concurrently makes reference to also the status of the input ports P1, P2 and P3 thereof. In the event abnormality is detected, the signal from the signal processing unit delivering such an abnormality signal is rendered ineffective, and the controlled status of the device is shifted toward a safety range of operation.

In accordance with the invention, as described above, malfunctioning of electronic equipments can be prevented completely without the need of complicated electrostatic shield or impedance adjustment in a control circuit effected by insertion of a capacitor.

What we claim is:

1. A safety device for electronic equipment comprising:

a printed circuit board having mounted thereon at least a portion of said electronic equipment;

electric field detecting means including at least one antenna comprising a set of two linear electric conductor patterns, one end of each of said patterns being arranged in relative proximity to each other, and the other end of each of said patterns extending in substantially opposite directions, said patterns being formed on said printed circuit board, each of said patterns having a length less than $\frac{1}{8}$ of the wavelength of an electric signal having a frequency which is the highest of a range of possible frequencies of an alternating-current electric field to be detected and delivering an alternating-current corresponding to the alternating-current electric field applied thereto;

signal level comparison means including at least one rectification means for converting an alternating-current signal to a direct-current signal, detecting a level of the electric signal output from said electric field detecting means, comparing the detected level with at least one reference level, and delivering the compared result; and abnormality processing setting means for setting the electronic equipment into a predetermined abnormality processing state, when the output of said signal level decision means is found correspondent to detection of the high-level electric field.

2. A safety device for an electronic equipment according to claim 1, in which said electric field detecting means, said signal level comparison means and said abnormality processing setting means are arranged on the same printed circuit board.

3. A safety device for an electronic equipment according to claim 1, in which said abnormality processing setting means includes at least one abnormality informing means and actuates said abnormality informing means when the output of said signal level comparison means is found correspondent to detection of the high-level electric field.

4. A safety device for an electronic equipment according to claim 1, in which said signal level comparison means includes rectification means connected to an output of said electric field detecting means, smoothing means connected to an output of said rectification means, and an analog comparator for comparing the output level of said smoothing means with a predetermined direct-current reference level.

5. A safety device for an electronic equipment according to claim 1, in which said abnormality processing setting means includes holding means for holding a setting of an abnormality processing state for a predetermined time, when the output of said signal level comparison means is found correspondent to detection of the high-level electric field.

6. A safety device for an electronic equipment according to claim 1, in which an output of said abnormality processing setting means is connected to a reset terminal for setting the electronic equipment into an initial state.

* * * * *